(12) United States Patent
Zhang

(10) Patent No.: US 10,162,010 B2
(45) Date of Patent: Dec. 25, 2018

(54) WIRELESS NETWORK BASED BATTERY MANAGEMENT SYSTEM

(71) Applicants: Robert Bosch GmbH, Stuttgart (DE); Mingliang Zhang, Shanghai (CN)

(72) Inventor: MingLiang Zhang, Shanghai (CN)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/529,702

(22) PCT Filed: Nov. 28, 2014

(86) PCT No.: PCT/CN2014/092549
§ 371 (c)(1),
(2) Date: May 25, 2017

(87) PCT Pub. No.: WO2016/082208
PCT Pub. Date: Jun. 2, 2016

(65) Prior Publication Data
US 2017/0328956 A1   Nov. 16, 2017

(51) Int. Cl.
*G01R 31/36* (2006.01)
*H02J 7/00* (2006.01)
(Continued)

(52) U.S. Cl.
CPC ...... *G01R 31/3606* (2013.01); *B60L 11/1861* (2013.01); *B60L 11/1877* (2013.01);
(Continued)

(58) Field of Classification Search
CPC .................................. B60L 11/1851–11/1879
See application file for complete search history.

(56) References Cited

U.S. PATENT DOCUMENTS

2007/0299620 A1   12/2007   Yun et al.
2010/0121587 A1    5/2010   Vian et al.
(Continued)

FOREIGN PATENT DOCUMENTS

CN   104052102 A   9/2014
JP   2012-103095 A   5/2012

OTHER PUBLICATIONS

International Search Report corresponding to PCT Application No. PCT/CN2014/092549, dated Aug. 27, 2015 (German and English language document) (3 pages).

*Primary Examiner* — Laura Nguyen
(74) *Attorney, Agent, or Firm* — Maginot, Moore & Beck LLP

(57) ABSTRACT

A wireless network based battery management system is provided, which comprises an off-board subsystem and an on-board subsystem, wherein the off-board subsystem comprising an off-board data storage for storing historic data of a on-board battery system and data of other battery systems, and an off-board data processing device for analyzing and processing the stored data and establishing and validating off-board battery models, mapping the accurate and complex off-board battery models into a simple off-board battery model, and generating parameters of the simple off board battery mode, and wherein the on-board subsystem selects a simple on-board battery mode corresponding to the simple off-board battery mode, updating parameter of the simple on-board battery mode with those of the simple off-board battery mode, and calculates battery status of the on-board battery system. A method of using the wireless network based battery management system described above is also provided.

10 Claims, 3 Drawing Sheets

(51) Int. Cl.
  *B60L 11/18* (2006.01)
  *H01M 10/48* (2006.01)
  *H04Q 9/02* (2006.01)

(52) U.S. Cl.
  CPC ......... *B60L 11/1879* (2013.01); *H01M 10/48* (2013.01); *H02J 7/00* (2013.01); *H02J 7/0021* (2013.01); *H04Q 9/02* (2013.01); *Y02T 10/7055* (2013.01)

(56) References Cited

U.S. PATENT DOCUMENTS

| | | | |
|---|---|---|---|
| 2012/0038473 A1 | 2/2012 | Fecher | |
| 2013/0262067 A1* | 10/2013 | Zhang | G01R 31/3651 703/8 |
| 2014/0032141 A1 | 1/2014 | Subbotin et al. | |
| 2014/0089692 A1* | 3/2014 | Hanafusa | H01M 10/48 713/310 |
| 2014/0107976 A1 | 4/2014 | Kallfelz et al. | |
| 2015/0231986 A1* | 8/2015 | Li | B60L 11/123 701/22 |
| 2015/0239365 A1* | 8/2015 | Hyde | B60L 11/1861 701/2 |
| 2015/0251555 A1* | 9/2015 | Li | B60L 11/1861 701/22 |
| 2015/0251556 A1* | 9/2015 | Meyer | B60L 11/1861 701/22 |

* cited by examiner

WIRELESS NETWORK BASED BATTERY MANAGEMENT SYSTEM

This application is a 35 U.S.C. § 371 National Stage Application of PCT/CN2014/092549, filed on Nov. 28, 2014, the disclosure of which is incorporated herein by reference in its entirety.

Technical Field

The invention relates to a wireless network based battery management system (BMS), especially for a hybrid electric vehicle (HEV) or an electric vehicle (EV).

Background Art

Electric vehicles are gaining popularity as one of solutions for reducing green-house gas emissions of vehicles in view of their increased energy efficiency. Power supplies for the electric vehicles are mainly rechargeable chemical power sources, including secondary batteries.

A battery management system is an electronic system that manages a rechargeable battery, in particular a secondary battery pack and that functions to estimate accurately Status of Charge (SOC) of the battery, to monitor working status of the battery dynamically, and to balance energy between individual cells, such as by monitoring state of the battery, calculating data, reporting those data, protecting the battery, controlling its temperature, and/or balancing it.

The battery management system comprises a central controller. The central controller is a core of the BMS and manages the whole battery pack, and it is responsible for information processing and decision making.

Besides the central controller, so called local ECUs (local Electrical Control Units, LECUs) for BMS boards or slaves are provided. The LECUs are connected to the center controller and targeted for cell monitoring in the battery management system. The functions of the LECUs mainly include: cell voltage measurement, module temperature measurement, cell balancing, and communication with BMS controller etc. These functions are usually completed by ASICs (Application specific integrated chips) and MCUs (Micro control units).

The functions mentioned above are achieved by calculating parameters of complex battery models on servers of the battery management system based on offline testing data or local data. In most systems, parameters of the battery models are fixed. Some advanced algorithms, e.g. Kalman filters, are used to online change parameters to adapt to variation of battery status. These algorithms are complex and need powerful IC chips and are calculated only relying on local data.

However, due to limited data storage capacity, historic data of a target battery system and referrable data of other battery systems are not available, and due to limited computing power of on-board control chips, performance of BMS is limited.

There is a demand to solve the above problems.

SUMMARY OF THE INVENTION

An object of the invention is to provide a wireless network based battery management system, in which historic data and data from other batteries can be stored and fully utilized, accurate and complex battery models can be established and validated by providing an off-board subsystem, and then estimation of SOC, SOH (Status of Health) and even battery life can be performed by an on-board BMS of the wireless network based battery management system.

For this purpose, according to a first aspect of the invention, a wireless network based battery management system is provided, which comprises an off-board subsystem and an on-board subsystem, wherein the off-board subsystem comprising an off-board data storage for storing historic data of a target on-board battery system and data of other battery systems, and an off-board data processing device for analyzing and processing the stored data and establishing and validating accurate and complex off board battery models, mapping the off board battery models into a simple off board battery model, and generating parameters of the simple off-board battery mode, and wherein the on-board subsystem selects a simple on-board battery mode corresponding to the simple off-board battery mode, updating parameter of the simple on-board battery mode with those of the simple off-board battery mode, and calculates battery status of the on-board battery system.

According to a feasible embodiment, the off-board data storage is an internet based data storage.

According to a feasible embodiment, the battery status is one or more of the following: SOC, SOH and life estimation.

According to a feasible embodiment, the on-board subsystem measures battery variables of the on-board battery system and transmitted them to the off-board data storage via wireless communication.

According to a feasible embodiment, the parameters of the simple off-board battery mode are transmitted to the on-board subsystem via wireless communication.

According to a feasible embodiment, the simple on-board battery model is an Internal Resistance Equivalent Model or a One Order RC model.

According to a feasible embodiment, optimal parameters of the accurate and complex off-board battery models are calculated by an approximation method.

According to a feasible embodiment, the approximation method is least square method.

According to a feasible embodiment, the on-board subsystem is arranged in a target vehicle, and the off-board subsystem is arranged remote from the target vehicle.

According to a second aspect of the invention, a method of using the wireless network based battery management system is provided, wherein the method comprises: real-time measuring battery variables of the an-board battery system by the on-board subsystem and transmitting them to the off-board data storage of the off-board subsystem; analyzing and processing the data stored in the off board data storage by the off-board data processing device of the off-board subsystem, and establishing and validating off-board battery models; acquiring the real-time measured battery variables as parameters of the off-board battery models and calculating the off-board battery models; mapping the off-board battery models into a simple off-board battery model and generating parameters of the simple off-board battery model; selecting a simple on-board battery model on the on-board subsystem, and calculating battery status of the on-board battery system with parameters of the simple on-board battery model transmitted from the off-board subsystem.

By providing a wireless network based battery management system comprising an off-board subsystem which has a powerful data storage and a powerful computing capacity and an on-board BMS, historic data of a target on-board battery system and data from other batteries can be stored and fully utilized, accurate and complex battery models can be established and validated by the off-board subsystem, and then estimation of SOC, SOH (Status of Health) and even life can be achieved by the on-board BMS of the wireless network based battery management system. In this way, cost of on-board BMS chips of the on-board BMS can be reduced since only simple algorithms will be calculated on the on-board BMS. Effort of battery testing and parameterization can be reduced since historic data can be shared and used with real time variables of the target on-board battery system.

BRIEF DESCRIPTION OF THE DRAWINGS

Other objects, features and advantages of the present invention will become apparent from the following detailed description when taken in conjunction with the accompanying drawings. It should be appreciated that the drawing are only illustrative and are not depicted in scale.

DETAILED DESCRIPTION OF PREFERRED EMBODIMENTS

Embodiments of the invention will be described further in detail in combination with the drawings. The embodiments herein are merely intended to illustrate the basic principles of the invention, instead of limiting the scope of the invention.

A wireless network based battery management system according to the invention is designed for managing an on-board battery system, for example, loaded on a HEV or an EV, intelligently, for preventing individual batteries on-board from being over charged or over discharged, for prolonging service life, and for monitoring operating status of individual batteries. In the description of the present invention, the on-board battery system may comprise one or more battery packs. The term "on-board" means an object mounted or arranged in a target equipment, and in particular in this application mounted or arranged in a target vehicle in which the batteries are used, and the term "off-board" means an object mounted or arranged remote from the target equipment, and in particular in this application remote from the target vehicle.

For example, the wireless network based battery management system functions to measure a terminal voltage of individual batteries, measure a total voltage of the battery packs, measure a total current of the battery packs, calculate SOC, monitor operating status of power battery dynamically, display the measured real-time data, record and analyze the data, and balance energy between individual batteries etc.

Figure 1:
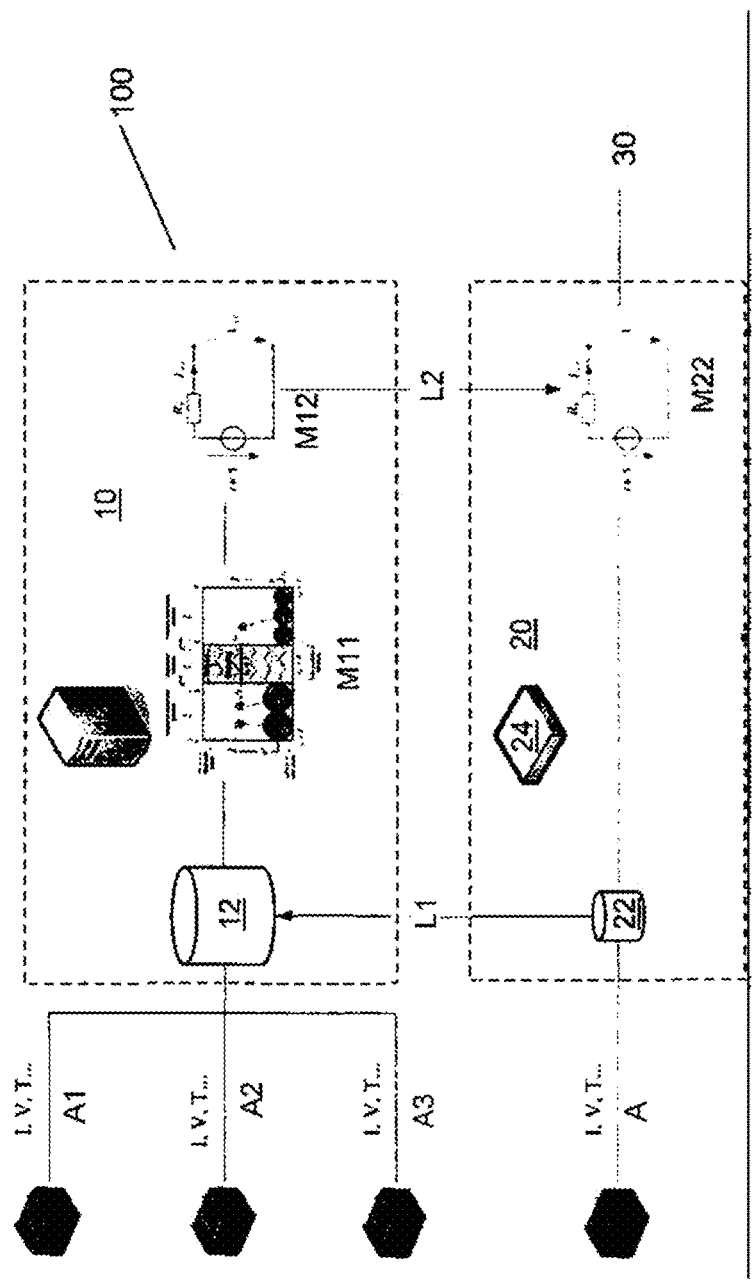
FIG. 1 is an illustrative view of a wireless network based battery management system according to the invention.

FIG. 1 is an illustrative view of a wireless network based battery management system 100 according to the present invention, which mainly comprises an off-board subsystem 10 and an on-board subsystem 20.

Advantageously, the off-board subsystem 10 comprises a powerful off-board data storage 12. The off-board data storage 12 can be configured as an internet based data storage and thus have a much larger data storage capacity than an on-board data storage 22 of the on-board subsystem 20.

In the off-board data storage 12, historic data of the on-board battery system 20 and data from other battery systems can be stored which are denoted by a subset A1, a subset A2, a subset A3 etc. In addition, data of the on-board battery system 20 which are real-time measured by the wireless network based battery management system 100, which is denoted by A in FIG. 1, can also be stored in the off-board data storage 12, optionally. Data A can be transmitted into the off-board data storage 12 via wireless communication LI (as shown in FIG. 1), for example.

The off board subsystem 10 may further comprise a powerful off-board data processing device 14. The off-board data processing device 14 can be configured as one ore more powerful off-board computers or any other data processing devices well known to a skilled in the art. Optionally, the off-board data processing device 14 may comprise its own storage device as a part of the off-board data storage 12, such as a memory on the off-board computer.

The off-board data processing device 14 is configured for analyzing and processing the data stored in the off board data storage 12 and for establishing and validating accurate and complex off-board battery models M11 based on the huge amount of data.

Parameters of the accurate and complex off-board battery models M11 can be updated with the latest data A which are real-time measured by a monitoring device of the on-board subsystem 20, and corresponding parameters can be calculated then by the off board data processing device 14 based on various algorithms according to the off-board battery models M11. Some approximation methods, e.g. least square method, can be used to find optimal parameters which meet the desired accuracy.

Preferably, combined with huge historic data of all battery systems, some advanced estimation, for example, life estimation can be calculated on the server and then transmitted to an on-board BMS 24 of the on-board subsystem 20 which will calculate SOC, SOH, remaining life and etc. with the updated parameters. Outputs of the on-board subsystem 20 which are denoted by 30 in FIG. 1 include SOC, SOH, and remaining life, but are not limited to those. SOC is a measure of the amount of energy stored in a battery versus the maximum amount of energy that can be stored, and is represented as a percentage. SOH is a figure of merit of the condition of a battery pack compared to its ideal conditions and the units of SOH are percent points (100% =the battery's conditions match the battery's specifications).

One example of the approximation methods is approximation of SOC-OCV curve which can be achieved by a two order polynomial spline approximation: $y=a_2x^2+a_1x+a_0$.

Another example is life estimation of the on-board battery system. A large amount of data information on actual life of similar battery systems can be stored in the off-board data storage 12 and be analyzed in the off-board data processing device 14, for example, relationship between remaining life and a charging/discharging current, relationship between remaining life and a charging/discharging cycle, and relationship between remaining life and a temperature, and etc. These relationships can be used to estimate lives of similar battery systems. Precise life estimation can be done on an on-board computer of the on-board BMS 24 of the on-board subsystem 20.

Then, the off-board data processing device 14 maps the accurate and complex off-board battery models M11 into a simple off-board battery model M12 whose parameters are to be transmitted to the on-board subsystem 20.

Figure 2:
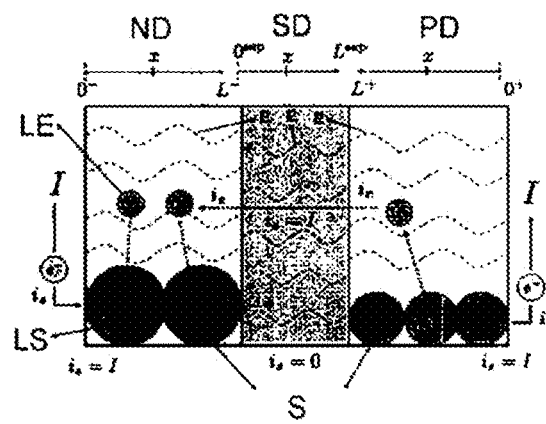
FIG. 2 is one example of complex off-board battery models established in off-board subsystem of the wireless network based battery management system according to the invention, which is an electrochemical batter model of a Li-battery.

Further details of mapping the off board battery models M11 into the simple off-board battery model M12 is given below with reference to FIG. 2. FIG. 2 shows one example of the off-board battery models M11, i.e. a SOC-OCV curve. In FIG. 2, "LS" refers to lithium in solid phase, "LE" refers to lithium in electrolyte phase, "ND" refers to a negative electrode domain, "SD" refers to a separator domain, "PD" refers to a positive electrode domain, "E" refers to electrodes, and "S" refers to solid particles in electrode.

Assuming 50 mV accuracy is given, the SOC-OCV curve can be generated from the off-board battery models M11. The whole SOC-OCV curve can be divided into N segments, and each segment can be described as $y=a_{n2}x^2+a_{n1}x+a_{n0}$, wherein y=OCV, and x=SOC. All the parameters [$a_{02}$, $a_{01}$, $a_{00}$], [$a_{12}$, $a_{11}$, $a_{10}$] ... [$a_{(N-1)2}$, $a_{(N-1)0}$] can be calculated on the off-board data processing device 14. In this way, the complex off-board battery models M11 can be mapped to the simple off-board battery model M12. These parameters are also be transferred to the on-board subsystem 20.

Due to the powerful computing capacity of the off-board data processing device 14, some advanced and complex algorithms, e.g. Kalman filters, can be used to online change parameters to adapt to variation of battery status. Due to the large data storage capacity of the off-board data storage 12, a huge amount of offline data and online data can be used to calculate the battery status.

As shown in FIG. 1, the on-board subsystem 20 of the wireless network based battery management system 100 mainly comprises an on-board battery management system (on-board BMS) 24 and an on-board data storage 22 which can be integrated into the on-board BMS 24 as a part of it.

As with most of conventional BMS, the on-board BMS 24 may comprises a central controller, a power electronics module, power lines, communication lines, one or more local controllers, the monitoring device as above, an on-board data storage 22, one or more charging/discharging modules, and other components.

The on-board BMS 24 monitors the on-board battery system and measures real-time battery variables of the on-board battery system, including a voltage, a current, a temperature etc. The measured battery variables are stored into the on-board data storage 22 directly and transmitted into the off-board data storage 12 via wireless communication LI.

Upon the off-board battery models M11 being mapped into the simple off-board battery model M12 in the off-board subsystem 10, the on-board BMS 24 selects a simple on-board battery model M22 which corresponds to the simple off-board battery model M12, Then, the on-board BMS 24 receives the parameters of the simple on-board battery model M12 as parameters of the off-board simple battery model M22, and then calculates real-time battery status, such as, SOC, SOH, remaining life etc. According to an embodiment, parameters of the simple on-board battery model M22 are transmitted from the simple off-board battery models M12 via wireless communication L2.

Figure 3:
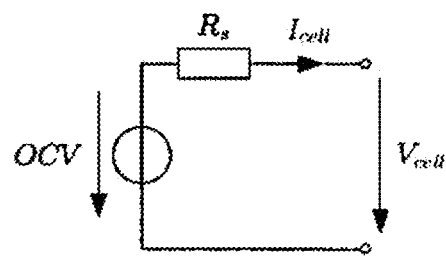
FIG. 3 is one example of a simple on-board battery model mapped from the complex off-board battery models.
Figure 4:
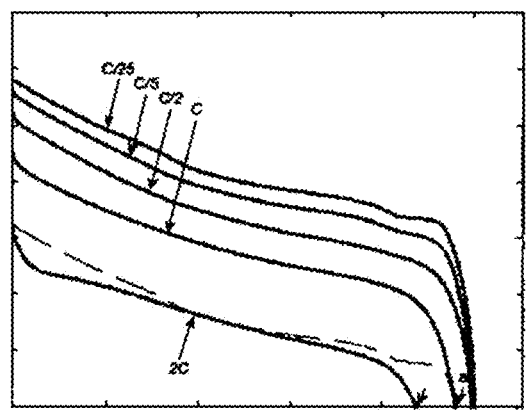
FIG. 4 is a typical SOC-OCV curve, in which a dashed line indicates a C/25 discharge curve with resistive losses.
Figure 5:
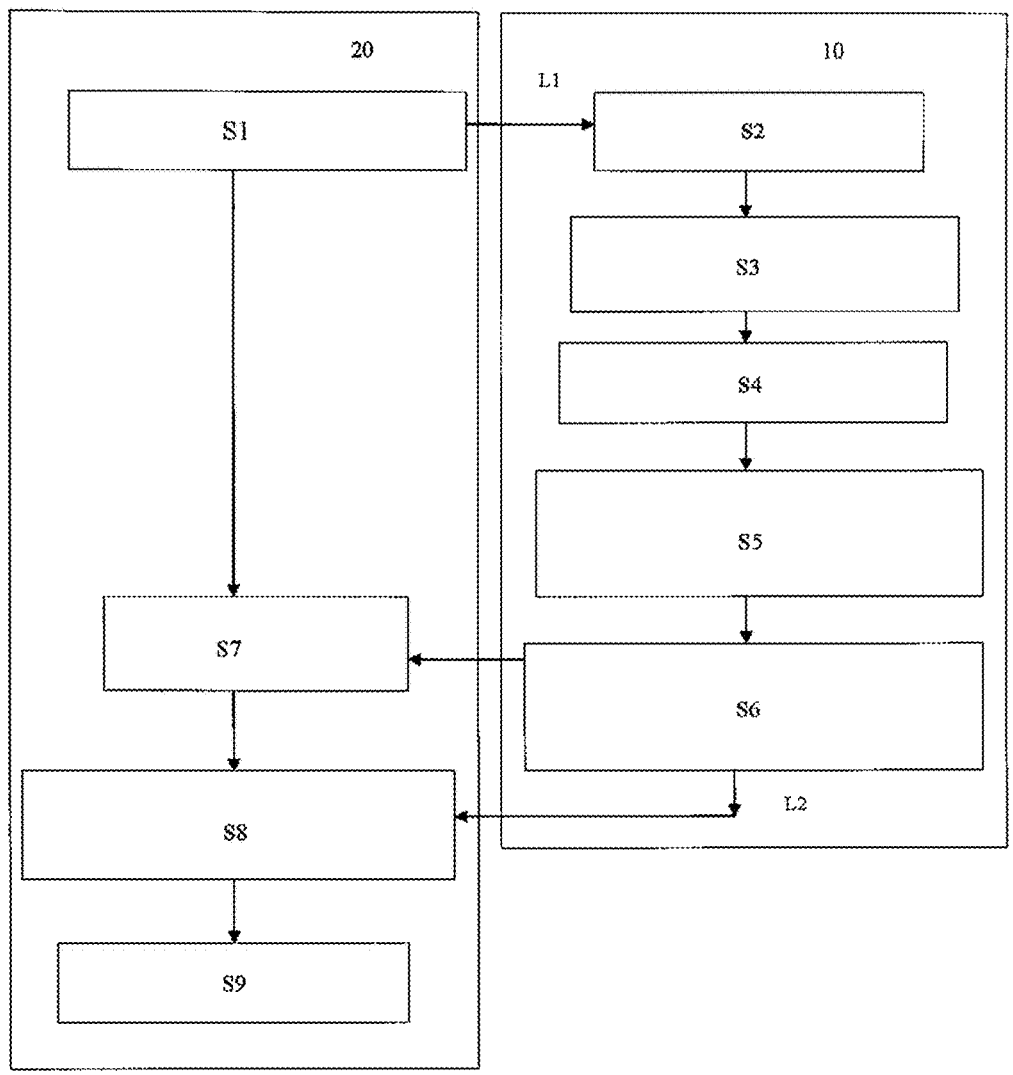
FIG. 5 is a method of implementing the wireless network based battery management system according to the invention.

According to an embodiment, the simple off-board battery model M12 and thus the corresponding simple on-board battery model M22 can be an internal resistance equivalent model which is shown in FIG. 3, and a variant parameter of an internal resistance of the internal resistance equivalent model will be updated according to accurate models on the servers. According to another embodiment, the simple on-board battery model M22 can be a One Order RC (resistor-capacitor) model whose parameters include an equivalent internal resistance, an equivalent polarization resistance, and an equivalent capacitor.

A method of using the wireless network based battery management system 100 is proposed in the following implementation, in which the method comprising the following steps:

In step S1, battery variables A of the on-board battery system are real-time measured by the monitoring device of the on-board BMS 24 of the on-board subsystem 20;

In step S2, battery variables A are stored in the on-board data storage 22 and transmitted via wireless communication to the off-board data storage 12 of the off-board subsystem 10 and stored in the off-board data storage 12;

In step S3, the data stored in the off-board data storage 12 of the off-board subsystem 10 (including A1, A2, A3 . . . ) are analyzed and processed by the off-board data processing device 14 of the off-board subsystem 10;

In step S4, the off-board battery models M11 are established and validated by the off-board data processing device 14 of the off-board subsystem 10 based on the data stored in the off-board data storage 12 of the off-board subsystem 10;

In step S5, parameters of the off-board battery models M11 are updated with the real-time measured data A;

In step S6, the off-board battery models M11 are mapped into a simple off-board battery model M12 in the off-board subsystem 10 and generating parameters of the simple off-board battery model M12;

In step S7, a simple on-board battery model M22 is selected in the on-board subsystem 20 which corresponds to the simple off-board battery model M12;

In step S8, parameters of the simple on-board battery model M22 are updated with the parameters of the simple off-board battery model M12, in which the parameters of the simple off-board battery model M12 is transmitted to the on-board subsystem 20 also via wireless communication; and In step S9, battery status of the on-board battery system is calculated according to the simple on-board battery model M22.

With a wireless network based battery management system comprising an off-board subsystem and an on-board EMS, by providing the off-board subsystem with an off-board data storage which has a much larger data storage capacity than a conventional BMS and an off-board data processing device which has a much larger data processing capacity than a conventional BMS, historic data of a target on-board battery system and data from other batteries can be stored and fully utilized, accurate and complex off-board battery models can be established and validated, and the accurate and complex off-board battery models can be mapped into a simple off-board battery model; and by configuring the on-board BMS with almost all functions as the conventional BMS, accurate estimation of SOC, SOH and even life can be achieved by the on-board BMS of the wireless network based battery management system according to a simple on-board battery model corresponding to the simple off-board battery model.

In addition, a huge amount of historic data is stored in the off-board data storage and so the on-board (or local) data storage can be reduced. Complex algorithms are carried out on off-board data processing device and only simple algorithms are calculated on-board control units of the on-board subsystem and so control chips can be much cheaper. Effort of battery testing and parameterization can be reduced since historic data can be shared and used with real time variables of the target on-board battery system.

The disclosure described above is merely preferred embodiments of the invention. It should be noted that various developments and substitutions made by a skilled in the art without departure from the technical principle of the invention should be considered as falling within the protecting scope of the invention.

The invention claimed is:

1. A wireless network based battery management system comprising:
    an off-board subsystem including (i) an off-board data storage configured to store data including historic data of a target on-board battery system and data of other battery systems, and (ii) an off-board data processing device, the off-board data processing device configured to:
        establish and validate at least one first off-board battery model by processing the stored data; and
        generate parameters of a second off-board battery model, which has a different and simplified form compared to the at least one first off-board battery model, by mapping parameters of the at least one first off-board battery model into the second off-board battery model; and
    an on-board subsystem having an on-board data processing device, the on board data processing device configured to:
        select an on-board battery model corresponding to the second off-board battery model;
        update a parameter of the on-board battery model with the generated parameters of the second off-board battery model; and
        calculate a battery status of the target on-board battery system using the on-board battery model.

2. The wireless network based battery management system according to claim 1, wherein the off-board data storage of the off-board subsystem is an internet based data storage.

3. The wireless network based battery management system according to claim 1, wherein the battery status is at least one of the following: a state of charge, a state of health, and a life estimation.

4. The wireless network based battery management system according to claim 1, wherein the on-board subsystem is configured to measure battery variables of the target on-board battery system and transmit the measured battery variables to the off-board data storage of the off-board subsystem via wireless communication.

5. The wireless network based battery management system according to claim 1, wherein the off-board subsystem is configured to transmit the generated parameters of the second off-board battery model to the on-board subsystem via wireless communication.

6. The wireless network based battery management system according to claim 1, wherein the second off-board battery model and the on-board battery model are one of Internal Resistance Equivalent Models and One Order RC models.

7. The wireless network based battery management system according to claim 1, wherein the off-board data processing device of the off-board subsystem is configured to calculate optimal parameters of the first off-board battery models by an approximation method using the stored data.

8. The wireless network based battery management system according to claim 7, wherein the approximation method is a least square method.

9. The wireless network based battery management system according to claim 1, wherein the on-board subsystem is arranged in a target vehicle, and the off-board subsystem is arranged remote from the target vehicle.

10. A method of using a wireless network based battery management system having an off-board subsystem and an on-board subsystem, the method comprising:
    measuring battery variables of a target on-board battery system in real-time with the on-board subsystem;
    transmitting the measured battery variables to an off-board data storage of the off-board subsystem, the off-board data storage being configured to store data including historic data of the target on-board battery system and data of other battery systems;
    establishing and validating at least one first off-board battery model by processing the data stored in the off-board data storage with an off-board data processing device of the off-board subsystem;
    acquiring the measured battery variables as parameters of the at least one first off-board battery model and calculating the at least one first off-board battery model;
    generating parameters of a second off-board battery model, which has a different and simplified form compared to the at least one first off-board battery model, by mapping the parameters of the least one first off-board battery model into the second off-board battery model with the off-board data processing device of the off-board subsystem;
    selecting an on-board battery model corresponding to the second off-board battery model with an on-board data processing device of the on-board subsystem;
    updating a parameter of the on-board battery model with the generated parameters of the second off-board battery model with the on-board data processing device of the on-board subsystem; and
    calculating a battery status of the target on-board battery system using the generated parameters with the on-board data processing device of the on-board subsystem.

* * * * *